(12) United States Patent
Ogata et al.

(10) Patent No.: US 11,515,121 B2
(45) Date of Patent: Nov. 29, 2022

(54) ELECTRON BEAM DEVICE

(71) Applicant: Hitachi High-Technologies Corporation, Tokyo (JP)

(72) Inventors: Tomohiko Ogata, Tokyo (JP); Hisaya Murakoshi, Tokyo (JP); Masaki Hasegawa, Tokyo (JP); Noriyuki Kaneoka, Tokyo (JP); Katsunori Onuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 625 days.

(21) Appl. No.: 16/660,152

(22) Filed: Oct. 22, 2019

(65) Prior Publication Data

US 2020/0152415 A1    May 14, 2020

(30) Foreign Application Priority Data

Nov. 8, 2018   (JP) .............................. JP2018-210323

(51) Int. Cl.
*H01J 37/29* (2006.01)
*H01J 37/22* (2006.01)
(Continued)

(52) U.S. Cl.
CPC .............. *H01J 37/29* (2013.01); *H01J 37/05* (2013.01); *H01J 37/10* (2013.01); *H01J 37/20* (2013.01);
(Continued)

(58) Field of Classification Search
CPC ........... H01J 37/22; H01J 37/226; H01J 37/29
See application file for complete search history.

(56) References Cited

U.S. PATENT DOCUMENTS

2007/0181808 A1    8/2007   Murakoshi et al.
2008/0315093 A1*  12/2008   Hasegawa ............. H01J 37/026
                                                           250/372
(Continued)

FOREIGN PATENT DOCUMENTS

DE    11 2016 006 427 T5    10/2018
JP         2009-4114 A        1/2009
(Continued)

OTHER PUBLICATIONS

German-language Office Action issued in German Application No. 10 2019 217 080.3 dated Feb. 28, 2022 with English translation (13 pages).
(Continued)

*Primary Examiner* — Eliza W Osenbaugh-Stewart
(74) *Attorney, Agent, or Firm* — Crowell & Moring LLP (57) ABSTRACT

In an electron beam device provided with two columns including an irradiation optical system and an imaging optical system, a photoelectron image for use in adjusting the irradiation optical system is made sharper. The electron beam device includes: an irradiation optical system which irradiates a sample placed on a stage with an electron beam; a light irradiation unit 50 which irradiates the sample with light containing ultraviolet rays; a sample voltage control unit 44 which applies a negative voltage to the sample so that, before the electron beam reaches the sample, the electron orbit inverts; and an imaging optical system which acquires a mirror electron image by forming an image of mirror electrons reflected by application of the negative voltage. In the electron beam device, the imaging optical system includes a sensor 32 which obtains a mirror electron image and a stray light suppression part 27 which is provided between the sensor and the stage 31 and which suppresses reaching the sensor of the light emitted from the light irradiation unit.

10 Claims, 6 Drawing Sheets

(51) Int. Cl.
- *H01J 37/20* (2006.01)
- *H01J 37/10* (2006.01)
- *H01J 37/05* (2006.01)
- *H01J 37/26* (2006.01)

(52) U.S. Cl.
CPC ............ *H01J 37/22* (2013.01); *H01J 37/226* (2013.01); *H01J 37/26* (2013.01); *H01J 2237/1501* (2013.01)

(56) References Cited

U.S. PATENT DOCUMENTS

| | | | |
|---|---|---|---|
| 2011/0068267 A1 | 3/2011 | Hasegawa et al. | |
| 2012/0006987 A1* | 1/2012 | Rue | H01J 37/3005 250/332 |
| 2013/0088774 A1 | 4/2013 | Mochizuki | |
| 2019/0079025 A1 | 3/2019 | Hasegawa et al. | |
| 2019/0108969 A1 | 4/2019 | Ogata et al. | |

FOREIGN PATENT DOCUMENTS

| | | |
|---|---|---|
| JP | 2013-64675 A | 4/2013 |
| WO | WO 2011/126041 A1 | 10/2011 |
| WO | WO 2016/002003 A1 | 1/2016 |
| WO | WO 2017/168482 A1 | 10/2017 |

OTHER PUBLICATIONS

Japanese-language Office Action issued in Japanese Application No. No. 2018 210323 dated Jul. 5, 2022 with English translation (nine (9) pages).

* cited by examiner

ELECTRON BEAM DEVICE

CROSS-REFERENCE TO RELATED APPLICATION

This application claims priority to Japanese Patent Application No. 2018-210323 filed on Nov. 8, 2018, the entire contents of which are incorporated by reference herein.

TECHNICAL FIELD

The present invention relates to an electron beam device, and more particularly, to an electron beam device provided with two columns including an irradiation optical system and an imaging optical system.

BACKGROUND ART

An electron beam device is a device which irradiates a sample with an electron beam emitted from an electron gun. In Patent Literature 1, an electron beam device is disclosed which has two columns including an irradiation optical system and an imaging optical system and in which, in a state with a sample applied with a negative potential, electrons emitted from the irradiation optical system to the sample are reflected from the neighborhood of the sample surface and an image of the reflected electrons (a mirror electron image) is obtained in the imaging optical system. Furthermore, in the Patent Literature 1, it is described that sample defects are detected by irradiating the sample with ultraviolet rays of a specific wavelength thereby charging the sample and irradiating the charged sample with an electron beam.

Patent Literature 2, similar to Patent Literature 1, discloses an electron microscope provided with two optical systems. In Patent Literature 2, a charged particle beam device capable of highly accurately adjusting the optical axes of the irradiation optical system and the imaging optical system and a method of the adjustment are disclosed.

CITATION LIST

Patent Literature

[Patent Literature 1] International Publication No. 2016/002003
[Patent Literature 2] International Publication No. 2017/168482

SUMMARY OF INVENTION

Technical Problem

In Patent Literature 1, how to adjust optical axes in an electron beam device provided with two columns including an irradiation optical system and an imaging optical system is not described. In Patent Literature 2, it is disclosed that an electron microscope is mounted with an ultraviolet optical system and that photoelectrons generated when a sample is irradiated with ultraviolet rays are used for optical axis adjustment for an imaging lens system.

According to Patent Literature 2, the imaging optical system is adjusted using a photoelectron image, but photoelectrons are lower in intensity than mirror electrons, so that, to secure the contrast of the photoelectron image, it is necessary to increase the amount of photoelectrons, for example, by increasing the intensity of the ultraviolet light emitted from the ultraviolet optical system to the sample. In this connection, however, a problem has been found that ultraviolet rays emitted from the ultraviolet optical system enter, after being reflected and scattering in the housing, the sensor for obtaining a photoelectron image as stray light, thereby, making a clear photoelectron image unobtainable.

The present invention provides an electron beam device which has two columns including an irradiation optical system and an imaging optical system and in which optical axis adjustment can be performed using a sharper photoelectron image.

Solution to Problem

An electron beam device according to an embodiment for achieving the above object includes: an irradiation optical system which irradiates a sample placed on a stage with an electron beam; a light irradiation unit which irradiates the sample with light containing ultraviolet rays; a sample voltage control unit which applies a negative voltage to the sample so that, before the electron beam reaches the sample, the electron orbit inverts; and an imaging optical system which acquires a mirror electron image by forming an image of mirror electrons reflected by application of the negative voltage. In the electron beam device, the imaging optical system includes a sensor which obtains a mirror electron image and a stray light suppression part which is provided between the sensor and the stage and which suppresses reaching the sensor of the light emitted from the light irradiation unit.

Advantageous Effects of Invention

In an electron beam device provided with two columns including an irradiation optical system and an imaging optical system, a photoelectron image for use in adjusting the irradiation optical system can be made sharper.

Other objects and novel features will become apparent from the description of the present specification and attached drawings.

DESCRIPTION OF EMBODIMENTS

A semiconductor device manufacturing process includes a process of forming a fine circuit on a wafer made of, for example, Si or SiC polished to be like a mirror surface. If the wafer has foreign objects or scratches thereon or includes crystal defects, defects or material deterioration may develop in a circuit pattern formation process. This may cause inability of a manufactured device to operate normally, unavailability of desired electrical characteristics or deterioration of operational reliability of the device.

The electron beam device of the present embodiment is a mapping electron microscope suitable for inspecting such wafers at high speed. More specifically, in the electron beam device of the present embodiment, an electron beam is emitted toward a sample to irradiate an entire field to be inspected on a wafer surface perpendicularly to the wafer surface and in an approximately parallel state. At this time, a negative voltage equivalent to or slightly larger than the acceleration voltage of the irradiation electron beam is applied to the wafer surface causing the electron beam to be inverted immediately above the wafer surface by about 180 degrees with respect to its incident direction. Using an electron lens, the inverted electrons are famed into an image for inspection. Such inverted electrons will hereinafter be referred to as "mirror electrons" and electron beam devices capable of obtaining mirror electron images will be referred to as "mirror electron microscopes."

In the following, an embodiment and a working example will be described with reference to drawings. However, in the following description, identical components will be denoted by identical reference symbols and repetitive description may be omitted.

Figure 1:
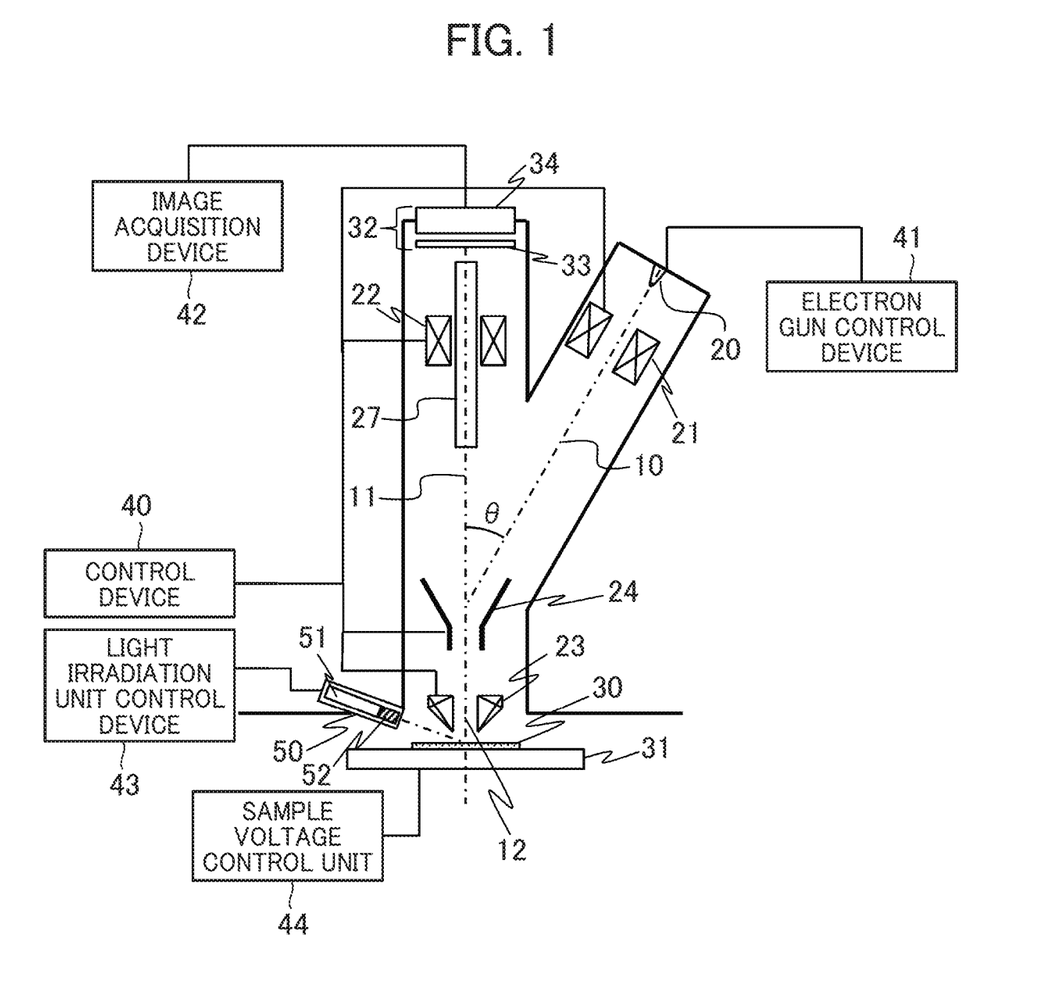
FIG. 1 is a diagram showing an example of an electron beam device provided with two optical systems (columns).

With reference to FIG. 1, a configuration of a mirror electron microscope for generating an image (mirror electron image) by detecting mirror electrons will be described. A sample 30 is positioned such that the sample surface is perpendicular to an objective lens optical axis 12 (ideal optical axis of the beam). Electrons emitted from an electron gun 20 are accelerated, for example, by an acceleration electrode, not shown, and foam an electron beam (electron rays). The electron beam is converged by irradiation lens 21 and passes through the optical axis of an irradiation optical system (referred to as an "irradiation system optical axis") 10. Note that there are cases in which the irradiation lens 21 is composed of plural lenses. The electron beam converged by the irradiation lens 21 is deflected by a beam separator 24 so as to travel along the path of the objective lens optical axis 12. The irradiation electron beam is converged on the back focal plane of the objective lens 23 and is emitted toward the sample 30. The electron beam deflected by the beam separator 24 is made a parallel beam by the objective lens 23 and is emitted perpendicularly to the sample 30 along the object lens optical axis 12. On the other hand, the sample 30 or a stage 31 is applied with a negative voltage from a sample voltage control unit 44. The negative voltage applied from the sample voltage control unit 44 is approximately equal to or slightly higher than the acceleration voltage applied to between the tip of the electron gun 20 and the acceleration electrode, so that the irradiation electron beam is reflected toward an imaging element without reaching the sample 30. The irradiation electron beam that does not reach the sample can generate an image, not of a sample surface shape, but reflecting a potential distribution on the sample surface (equipotential plane). The inverted electron beam is, after passing the objective lens optical axis 12, is guided by the beam separator 24 to the optical axis of an imaging optical system (referred to as an "imaging system optical axis") 11 causing a mirror electron image to be famed by an imaging lens 22 over a sensor 32. In the present example, the sensor 32 includes a scintillator 33 and a camera 34. Though, in the present example, the imaging lens 22 is represented as singular, there may be plural imaging lenses. The camera 34 can obtain, by imaging the light emitted by the scintillator 33 using the incident electron beam, an optical image converted from an electron beam image. The camera 34 may be a two-dimensional imaging element, for example, a CCD (Charge-Coupled Device) image sensor. This is used to obtain a signal for imaging the potential distribution on the sample.

Note that the irradiation optical system and the imaging optical system are controlled by a control device 40 and that the electron gun 20 is controlled by an electron gun control device 41. Also, the output of the sensor 32 is inputted to an image acquisition device 42 and undergoes necessary image processing.

As described above, whereas, in the mirror electron microscope, the position of the light source (electron gun 20) of the irradiation optical system differs from the imaging position (sensor 32) of the imaging optical system, it is necessary to make the irradiation system optical axis 10 and the imaging system optical axis 11 coincide, on the sample 30, with the objective lens optical axis 12. This makes it necessary to separate the beam of the irradiation optical system and the beam of the imaging optical system by deflecting the beam of the irradiation optical system using the beam separator 24. To be specific, in the case of the configuration shown in FIG. 1, the beam separator 24 is required to have been adjusted to deflect the electron beam emitted along the irradiation system optical axis 10 by angle θ (angle formed between the irradiation system optical axis 10 and the objective lens optical axis 12). At the same time, for electrons reflected at a deceleration electric field famed immediately above the sample 30 and flying in the direction from the sample 30 toward the beam separator 24, the electric field and the magnetic field of the orthogonal electromagnetic field of the beam separator 24 are required to have been adjusted to cause the electrons to head for the scintillator 33 along the imaging system optical axis 11. As the beam separator 24, for example, a Wien filter is used.

The configuration shown in FIG. 1 includes a light source for generating an electron beam for adjusting the optical axis of the imaging optical system. Namely, a light irradiation unit 50 and a light irradiation unit control device 43 are provided. The light irradiation unit 50 is mounted to emit ultraviolet rays toward the electron beam irradiation position of the sample 30 (ideal position to be reached by the electron beam emitted from the electron gun 20 (immediately below the ideal optical axis of the electron beam)). The light irradiation unit 50 may be made smaller to be about as large as the field of view on the sample to be observed using an electron beam or may be made equal to or larger than the field of view. In the diagram, the light irradiation unit 50 is represented as being directly attached to the housing of the device, but it may be configured to introduce ultraviolet rays into the device using an optical fiber. Also, it is not necessary to provide a light irradiation unit exclusively for optical axis adjustment. For example, in the case of an electron microscope mounted with an ultraviolet light source for preventing charging of the sample 30 or for purposes of defect observation, the ultraviolet light source can also be used for optical axis adjustment. In this case, since the ultraviolet light source is mounted to emit ultraviolet light to an appropriate position, positional adjustment of the ultraviolet light source is not required. The photoelectrons emitted from the sample 30 irradiated with ultraviolet light emitted from the light irradiation unit 50 is accelerated toward the imaging optical system by the electric filed (a deceleration electric field for the incident electron beam) formed between the objective lens 23 (for example, at ground potential) and the sample 30 applied with a negative voltage. Thus, the light irradiation unit 50 and the sample 30 function, in a manner, as an electron source exclusively for the imaging optical system. In this example, the light irradiation unit 50 includes an ultraviolet lamp 51 as a light source and a filter 52 which limits the light emitted from the light source to a desired wavelength band. With this configuration, the light irradiation unit 50 can be realized at low cost.

Figure 2:
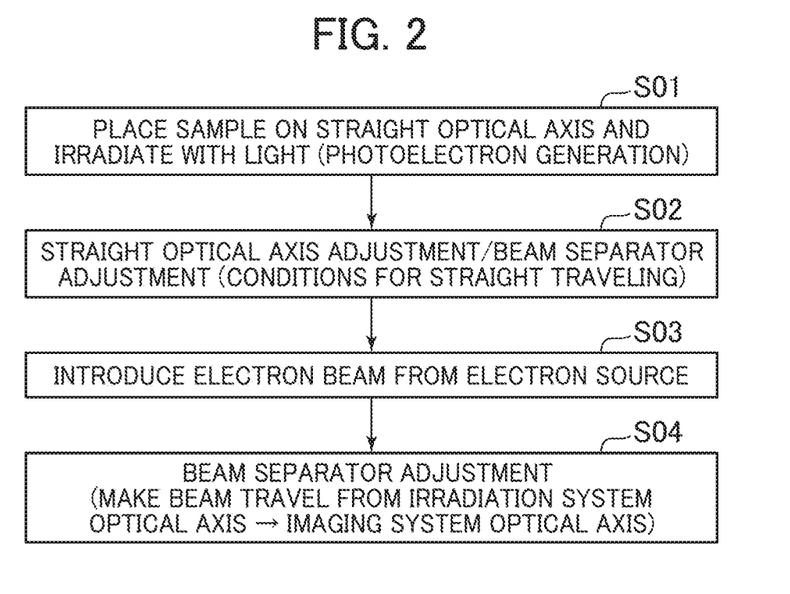
FIG. 2 is a flowchart showing an optical axis adjustment process for a mirror electron microscope.

With reference to FIG. 2, how to adjust the optical axes of the mirror electron microscope shown in FIG. 1 will be described. The processing algorithms illustrated in FIG. 2 and FIGS. 3 and 5, being described later, are stored in advance as programs in a predetermined storage medium, and an integrated control device (not shown) for controlling the mirror electron microscope automatically controls the components of the electron microscope in accordance with the programs.

First, the sample 30 is placed on the stage 31. The sample 30 is desirably one which easily generates photoelectrons by being irradiated with ultraviolet rays emitted from the light irradiation unit 50. Or, the ultraviolet rays emitted from the light irradiation unit 50 desirably have energy equal to or exceeding the work function of the sample 30. Moreover, in this flow, axis adjustment is performed through image processing, so that the sample 30 desirably has a pattern famed on its surface. In evaluating axial deviation based on a pattern image, the degree of axial deviation is determined based on the evaluation of image shifting (parallax), so that it is desirable to use a two-dimensionally spreading pattern (for example, a cross pattern) which, for evaluation of two-dimensional image shifting, enables evaluation of shifting in X-Y directions. The sample 30 may be fixed to a part of the stage 31 in advance.

When the sample 30 is placed on the ideal optical axis 12, ultraviolet rays are emitted from the light irradiation unit 50 to the sample 30 (step S01). When necessary, the ultraviolet ray irradiation region is adjusted using, for example, an optical lens so as to equalize the region with the field of view to be observed using an electron beam. However, when the ultraviolet ray irradiation region is larger than the field of view to be observed using an electron beam, a photoelectron image necessary for optical axis adjustment can be obtained.

Next, regarding the imaging system optical axis 11 and the deflection conditions for the beam separator 24, parameters are adjusted (step S02). In step S02, parameters of the imaging lens 22 and the Wien filter, i.e., the beam separator 24 are adjusted.

First, the position of the imaging lens 22 is adjusted so that the imaging optical axis 11 becomes the center of the image acquired by the sensor 32. In the configuration shown in FIG. 1, the column housing the imaging optical system is an upright column, so that, the objective lens optical axis 12 and the imaging system optical axis 11 coincide in a state without the Wien filter operating. Therefore, the position of the imaging lens 22 is adjusted such that the central axis of the imaging lens 22 is the center of the image obtained by the sensor 32. Hence, the optical conditions of the imaging lens 22 are set such that the photoelectrons emitted from the sample 30 irradiate, in a spot form, the scintillator 33, and the position of the imaging lens 22 is adjusted such that the spot famed by the photoelectrons becomes the center of the captured image. In cases where plural imaging lenses 22 are provided, the above procedure is to be performed for each of the plural lenses without allowing any unadjusted lenses to operate.

Subsequently, the Wien filter is adjusted. When the Wien filter has plural adjustment parameters, adjustment can be made by describing a constraint function between the plural parameters. By describing a constraint function, the number of parameters can be reduced and subsequent adjustment of the irradiation system optical axis 10 can be made easier. When generating a constraint function, wobbling in which the strength of the object lens 23 is varied at a constant amplitude may be performed for strict adjustment not to allow shifting of the image center and to check in detail a range of value combinations between the electric field E and the magnetic field B. Fine parameter adjustment as described above makes it possible to create a stricter constraint function. Furthermore, performing objective lens wobbling only with regard to the imaging system and, thereby, enhancing image resolution leads to improvement of the accuracy of the subsequent axial adjustment. When wobbling of the object lens causes image shifting (parallax), perform optical axis adjustment using an alignment deflector (not shown) so as to eliminate the parallax or reduce the parallax not to exceed a predetermined value.

Figure 3:
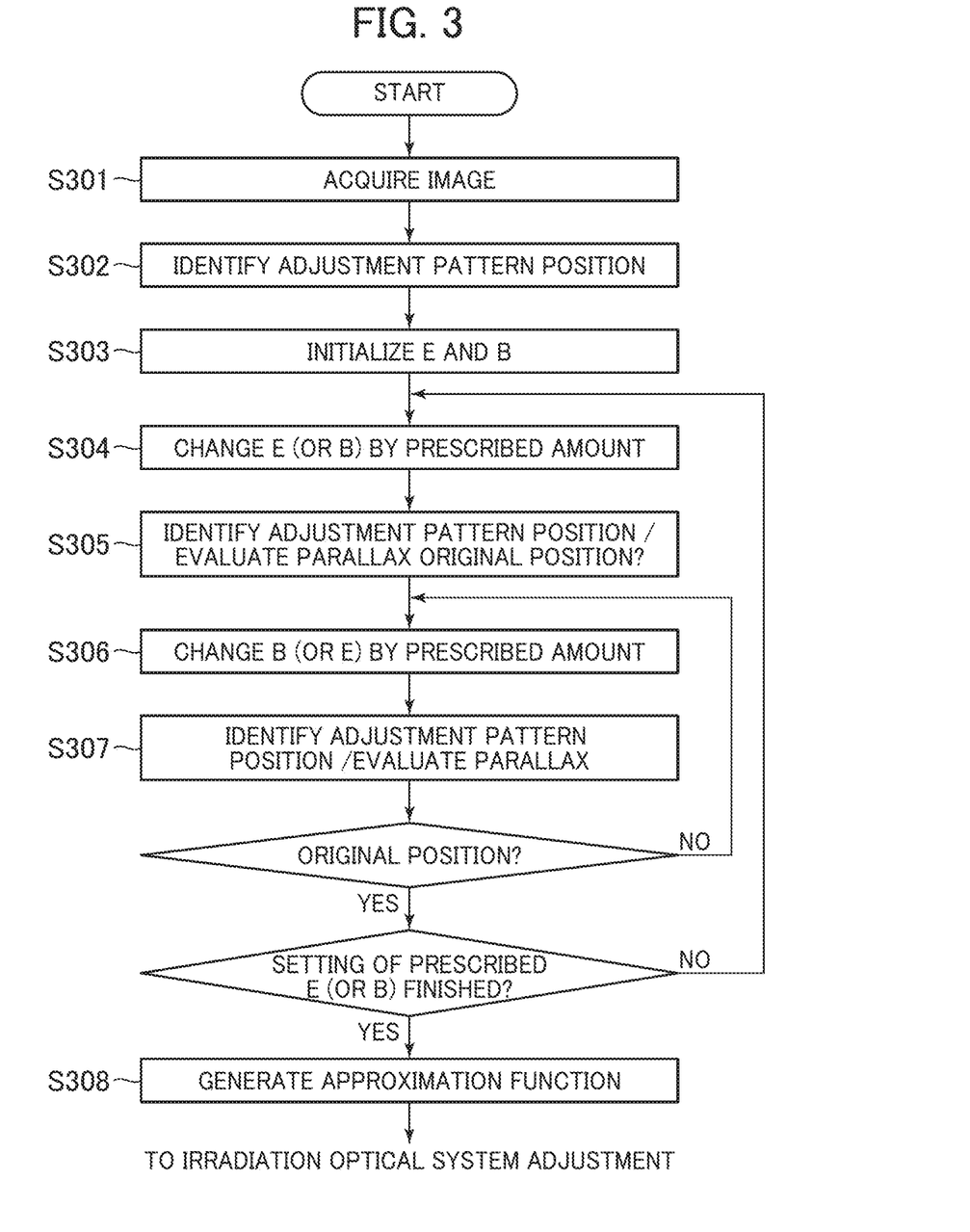
FIG. 3 is a flowchart showing an optical axis adjustment process for an imaging optical system performed based on light irradiation.

FIG. 3 is a flowchart representing an example of a process for generating an approximation function which is required when performing, using photoelectrons emitted when the sample is irradiated with ultraviolet rays, axial adjustment for the imaging optical system (in FIG. 3, Wien filter adjustment is represented) and irradiation optical system adjustment.

First, a sample on which an adjustment pattern recognizable as an image is formed is irradiated with ultraviolet rays and an image is obtained (step S301). As described in the foregoing, the adjustment pattern is used to monitor image shifting (parallax) caused when device condition is changed, so that it needs to be a pattern, for example, a cross pattern allowing two-dimensional displacements ($\Delta x$, $\Delta y$) to be easily recognized. Furthermore, to enable image recognition in a mirror state, it is desirable to make the charged state different between the pattern portion and other portions. For example, it is conceivable to form the pattern portion with an insulating part and other portions with a conductive part. When irradiated with ultraviolet rays, the sample emits photoelectrons. The photoelectrons are accelerated, by a deceleration electric field famed on the sample, toward the imaging optical system, pass the beam separator 24 (Wien filter) and the imaging lens 22, and reaches the scintillator 33. The emission of light from the scintillator 33 caused when electrons reaches the scintillator 33 is captured by the camera 34 and, thereby, an image of the region including the adjustment pattern is generated. Next, the position ($x_0$, $y_0$) of the adjustment pattern on the generated image is recognized through image processing (step S302).

After the initial position of the adjustment pattern is recognized, an electric field (E) famed between the electrodes included in the Wien filter and a magnetic field (B) adjusted by the current supplied to the coil are set (step S303). In this state, it is assumed that the Wien condition (a state in which the deflection action by the electric field E is cancelled by the magnetic field B) is maintained. In cases where a parallax occurs when the Wien filter is operated, correction not to cause image shifting is performed by adjusting the electric field E or the magnetic field B.

Next, one of the electric field E and the magnetic field B is changed by a predetermined amount (step S304), the resultant adjustment pattern position ($x_1$, $y_1$) is determined and, in this way, the parallax ($x_1-x_0$, $y_1-y_0$) caused by changing the Wien filter condition is calculated (step S305). The following description will be based on an example case in which the electric field E is changed from $E_0$ to $E_1$ in step S304.

To determine the magnetic field B that causes, when the electric field E is changed in step S304, the parallax ($x_1-x_0$, $y_1-y_0$) to become zero or equal to or smaller than a predetermined value, the parallaxes that result when the magnetic field B is gradually changed are evaluated (steps S306, S307). The state in which the parallax is zero (or equal to or smaller than a predetermined value) is a state in which the deflection action effected by the electric field E on the photoelectrons emitted from the sample is being cancelled by the deflection action of the magnetic field B. Until this state is achieved, steps S306 and S307 are repeated.

Figure 4:
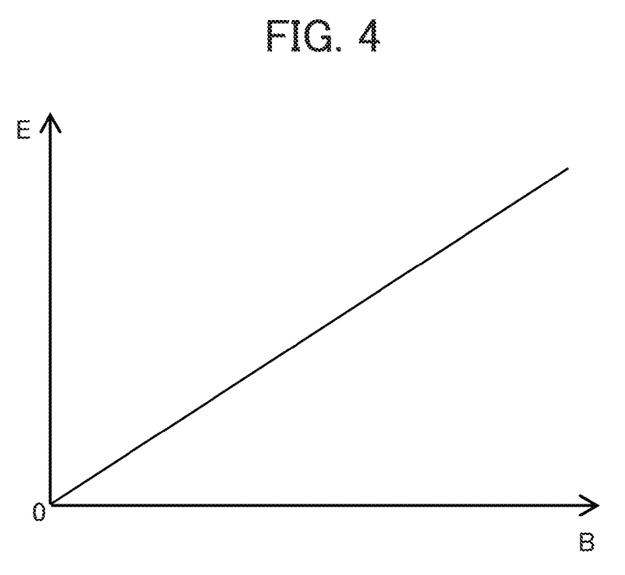
FIG. 4 shows an example of an approximation function representing changes of magnetic field B with respect to changes of electric field E satisfying Wien conditions.

After an appropriate magnetic field B (a current value to be supplied to the coil) is determined for an electric field E (a voltage value to be applied to the electrodes), steps S304 to S307 are repeated for the remaining ones of a predetermined number of electric fields E so as to determine the magnetic fields B that satisfy the Wien conditions for the respective electric fields B. After the predetermined number of combinations of electric fields E and magnetic fields B are determined, an approximation function representing the change in the magnetic field with respect to the change in the electric field E as shown in FIG. 4 is obtained, for example, by fitting (step S308).

By changing the electric field E and the magnetic field B based on the approximation function generated as described above, the conditions for the electric field E and the magnetic field B can be changed while maintaining them appropriately adjusted with respect to the imaging optical system. In the adjustment of the irradiation optical system being described later, by changing the electric field E and the magnetic field B based on the generated approximation function, the irradiation optical system is appropriately adjusted without causing the adjusted state of the imaging optical system to change. Though, for the present embodiment, an example of function generation using the electric field E and the magnetic field B as variables has been described, the function generation method is not limited to the above-described one. A function may be generated using other variable factors as variables. Further, plural combinations of electric fields E and magnetic fields B which satisfy the foregoing conditions may be acquired and stored without generating any function.

After the imaging optical system has been adjusted using a photoelectron image, the emission of ultraviolet rays from the light irradiation unit 50 is stopped and an electron beam is emitted from the electron gun 20 (step S03 in the flowchart shown in FIG. 2). Subsequently, to allow the irradiation electron beam to advance to the objective lens optical axis, the Wien filter is adjusted, for example, using a constraint function and reducing the number of parameters until an image can be seen, and, at the irradiation lens 21, the irradiation electron beam is adjusted so as to irradiate the sample 30 in a parallel state (step S04). At this time, the irradiation system may be adjusted by comparing the photoelectron image obtained in step S02 and the image obtained by irradiating the sample with the electron beam.

Figure 5:
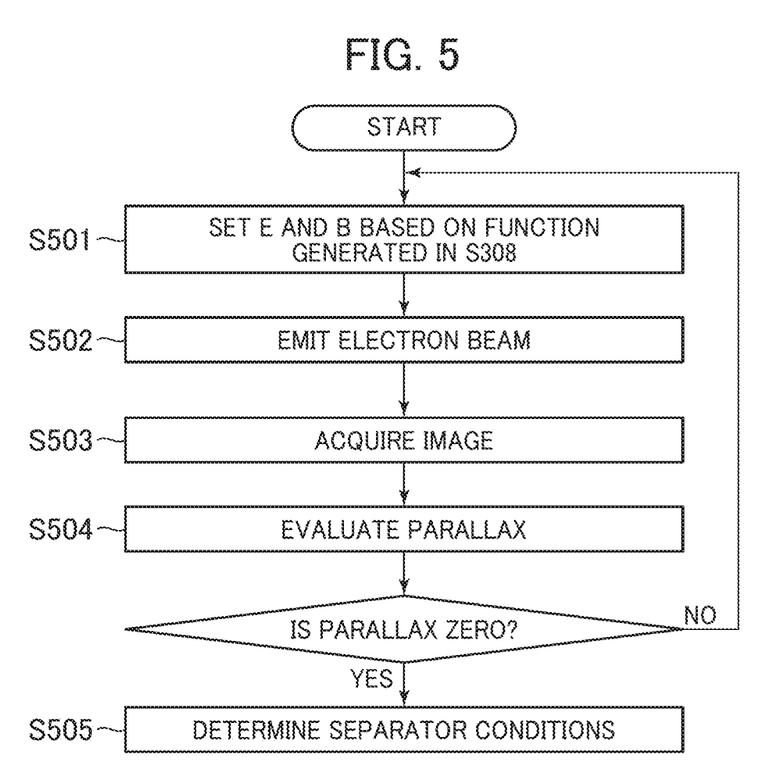
FIG. 5 is a flowchart showing an optical axis adjustment process for an irradiation optical system performed based on electron beam irradiation.

FIG. 5 is a flowchart representing an example of a process for adjusting the irradiation optical system (in FIG. 5, Wien filter adjustment is described as an example) after the imaging optical system has been adjusted. First, a beam separator adjustment process is performed, that is, to be specific, the electric field E and the magnetic field B are set based on the function generated in step S308 of the flowchart shown in FIG. 3 (step S501). In cases where the function has not been generated, an electric field E and a magnetic field B for initial setting are read out from the registered combinations of electric fields E and magnetic fields B. In a state with the electric field E and the magnetic field B initialized, an electron beam is emitted from the electron gun 20 (step S502) and, based on detection signals obtained by emitting the electron beam, an image is generated (step S503). Based on the generated image, the position of the adjustment pattern is determined and the parallax with respect to the original position (for example, the adjustment pattern position determined in step S302) is evaluated (step S504). By repeating the processing of steps S501 to S504 until the parallax is zero or smaller than a predetermined value, appropriate separator conditions can be found (step S505).

Note that the photoelectron image and the electron microscopic image appear differently. Therefore, in cases where their positional relationship cannot be accurately determined by a general shift detection method like pattern matching for evaluating positional relationship between two images, shifting between the two images may be determined, for example, by detecting the barycenters of the patterns and evaluating shifting between the barycenters. Various means are conceivable for barycenter detection. For example, it is conceivable to detect a barycenter of a pattern by extracting a contour of the pattern and obtaining a range image thereof.

As in the present embodiment, adjusting the irradiation optical system after the imaging optical system has been adjusted without moving the sample position (adjustment pattern position) enables high-accuracy adjustment free of changing of the pattern position to be the reference for parallax determination.

In this case, to obtain a higher-contrast photoelectron image in adjusting the imaging optical system, it is desirable to intensify the ultraviolet rays emitted from the ultraviolet lamp 51 included in the light irradiation unit 50. That is, more intensive ultraviolet rays than those emitted to irradiate a sample, for example, for static charge prevention or defect observation should be emitted. Furthermore, since the ultraviolet lamp 51 emits not only ultraviolet rays but also light in a wider wavelength band, it is also desirable to remove the filter 52 and widen the wavelength band of the light source for emission from the light irradiation unit 50.

However, a phenomenon has been observed in which, as described as a problem in the foregoing, when the sample 30 is irradiated with light containing strong ultraviolet rays emitted from the light irradiation unit 50, the light emitted from the light irradiation unit 50 is reflected from the sample 30 to be then reflected or scattered in the sample chamber housing, for example, the stage or in the column incorporating the imaging optical system (these are collectively referred to as a housing) and, thereby, directly enters the sensor 32 as stray light to eventually reduce the contrast of the photoelectron image. The camera 34 included in the sensor 32 has high detection sensitivity with respect to the band of light emitted from the scintillator 33 so as to detect light emission caused by collision between photoelectrons or mirror electrons and the scintillator 33. However, when light propagated from the light irradiation unit 50 into the housing (stray light) enters the sensor 32, with the wavelength band of the stray light overlapping with the detection band of the camera 34, distinction cannot be made between the light attributable to photoelectrons or mirror electrons and the stray light. In the case of photoelectron images generated from photoelectrons having lower energies than mirror electrons, contrast reduction is remarkable.

Hence, the electron beam device of the present embodiment includes a stray light suppressing part 27 to suppress entering of such stray light into the sensor 32 (see FIG. 1).

Figure 6:
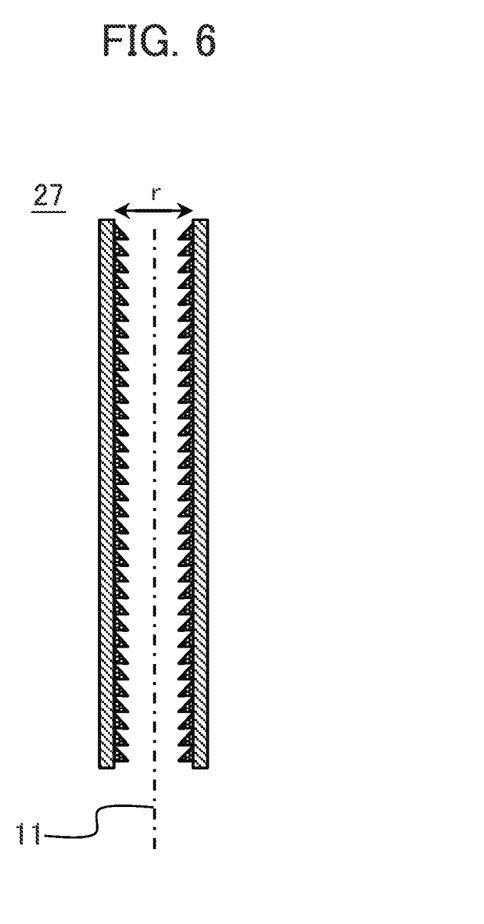
FIG. 6 is a sectional view of a stray light suppression part according to an example configuration.

FIG. 6 shows a sectional view of an example configuration of the stray light suppression part 27. The stray light suppression part 27 is a cylindrical part disposed such that the optical axis 11 of the imaging optical system passes through, and the figure shows a sectional view taken along a plane including the imaging system optical axis 11. For example, the stray light suppression part 27 has an inner diameter r and has an inner wall processed to suppress reaching the sensor 32 of the stray light. In the example shown in FIG. 6, the inner wall has an uneven surface formed by threading so as to reflect or scatter the stray light downward (toward the beam separator 24 side) and so as to, thereby, suppress upward propagation (toward the sensor 32 side) of the stray light. The means of making the inner wall surface uneven is not limited to threading. For example, it will also be possible to suppress stray light propagation by randomly scratching the inner wall surface. Further, the inner wall may be coated with a material, for example, carbon which absorbs stray light. The type of coating is not limited. For example, the inner wall may be painted, plated or dyed so as to absorb stray light. Also, the stray light suppression part 27 is desirably formed of a non-magnetic material such as aluminum. However, the amount of gas emission (degassing) through the inner surface of the stray light suppression part 27 is required not to exceed a reference value so that a vacuum state of the region to be passed by the electron beam can be maintained.

The size of the inner diameter of the stray light suppression part 27 is not particularly limited, either. However, when photoelectrons (or mirror electrons) hit the inner wall of the stray light suppression part 27, the electrons reaching the sensor 32 reduce. Therefore, the inner wall diameter of the stray light suppression part 27 should be such that photoelectrons (or mirror electrons) do not hit the inner wall. Or, the imaging lens 22 desirably suppresses spreading of photoelectrons (or mirror electrons) so as to prevent the photoelectrons (or mirror electrons) from hitting the inner wall of the stray light suppression part 27.

It is not necessary to provide the stray light suppression part 27 as a dedicated part. For example, in cases where the imaging optical system has a beam tube for passing an electron beam, the same effects can be obtained by processing a part of or a whole of the inner wall of the beam tube so as to suppress stray light propagation.

Further, the stray light suppression part 27 is not limited to a cylindrical part as illustrated in FIG. 6 and may be a shielding plate provided with an opening through which the imaging system optical axis 11 extends. The shielding plate, while allowing an electron beam to pass through the opening, shields stray light. To minimize stray light passing through the opening, it is desirable to make the opening diameter small. For this reason, it is desirable to place a shielding plate at the focal position of the electron beam in a state with the imaging lens 22 conditioned for obtaining a photoelectron image.

For stray light suppression, it is also desirable to apply some processing for suppressing stray light propagation, for example, some coating as described above to the inner wall of the housing. Normally, the interior of the mirror body of an electron microscope has metallic luster, so that stray light easily propagates to the sensor 32, for example, by reflection. Such stray light propagation can be suppressed by applying processing similar to that applied to the stray light suppression part 27 to the mirror body interior.

Also, plural stray light suppression parts and stray light suppression processing as described above may be used in combination.

LIST OF REFERENCE SIGNS

10: irradiation system optical axis, 11: imaging system optical axis, 12: objective lens optical axis, 20: electron gun, 21: irradiation lens, 22: imaging lens, 23: objective lens, 24: beam separator, 27: stray light suppression part, 30: sample, 31: stage, 32: sensor, 33: scintillator, 34: camera, 40: control device, 41: electron gun control device, 42: image acquisition device, 43: light irradiation unit control device, 44: sample voltage control unit, 50: light irradiation unit, 51: ultraviolet lamp, 52: filter

The invention claimed is:

1. An electron beam device, comprising:
   an irradiation optical system that irradiates a sample placed on a stage with an electron beam;
   a light irradiation unit that irradiates the sample with light containing ultraviolet rays;
   a sample voltage control unit that applies a negative voltage to the sample so that, before the electron beam reaches the sample, the electron orbit inverts; and
   an imaging optical system that acquires a mirror electron image by forming an image of mirror electrons reflected by application of the negative voltage,
   wherein the imaging optical system includes a sensor that obtains the mirror electron image and a stray light suppression part that is provided between the sensor and the stage and that suppresses reaching the sensor of the light emitted from the light irradiation unit.

2. The electron beam device according to claim 1, further comprising,
   an objective lens and
   a beam separator that deflects the electron beam emitted from the irradiation optical system so as to align the electron beam with the optical axis of the objective lens, the beam separator also separating the electron beam and the mirror electrons and guiding the mirror electrons to the optical axis of the imaging optical system.

3. The electron beam device according to claim 2,
   wherein the stray light suppression part is provided between the sensor and the beam separator.

4. The electron beam device according to claim 1,
   wherein the stray light suppression part is a cylindrical part disposed such that the optical axis of the imaging optical system extends therethrough, and
   wherein the stray light suppression part has an inner wall processed to suppress reaching the sensor of the light emitted from the light irradiation unit.

5. The electron beam device according to claim 4,
   wherein the inner wall of the stray light suppression part has an uneven surface formed to scatter or reflect the light emitted from the light irradiation unit or a surface coated with coating to absorb the light emitted from the light irradiation unit.

6. The electron beam device according to claim 4,
   wherein the imaging optical system acquires a photoelectron image by forming an image of photoelectrons emitted when the light irradiation unit irradiates the sample with light containing ultraviolet rays.

7. The electron beam device according to claim 6,
   wherein the imaging optical system includes an imaging lens and
   wherein the imaging optical system performs control using the imaging lens such that the photoelectrons do not hit the inner wall of the stray light suppression part.

8. The electron beam device according to claim 6,
   wherein the light irradiation unit includes an ultraviolet lamp and a filter that limits light emission from the ultraviolet lamp to a predetermined wavelength band and wherein, when the imaging optical system is to obtain the photoelectron image, the light irradiation unit irradiates the sample with light emitted from the ultraviolet lamp in a state with the filter removed.

9. The electron beam device according to claim 1, wherein the stray light suppression part is a shielding plate having an opening through which the optical axis of the imaging optical system extends.

10. The electron beam device according to claim 1, further comprising a housing that houses a sample chamber including the stage and a column including the imaging optical system, wherein the housing has an inner wall processed to suppress reaching the sensor of the light emitted from the light irradiation unit.

* * * * *